(12) United States Patent
Huai et al.

(10) Patent No.: US 7,777,261 B2
(45) Date of Patent: Aug. 17, 2010

(54) MAGNETIC DEVICE HAVING STABILIZED FREE FERROMAGNETIC LAYER

(75) Inventors: Yiming Huai, Pleasanton, CA (US); Zhitao Diao, Fremont, CA (US); Eugene Youjun Chen, Fremont, CA (US)

(73) Assignee: Grandis Inc., Milpitas, CA (US)

( * ) Notice: Subject to any disclaimer, the term of this patent is extended or adjusted under 35 U.S.C. 154(b) by 847 days.

(21) Appl. No.: 11/232,356

(22) Filed: Sep. 20, 2005

(65) Prior Publication Data
US 2007/0063236 A1    Mar. 22, 2007

(51) Int. Cl.
*H01L 29/94* (2006.01)
(52) U.S. Cl. ..................... 257/295
(58) Field of Classification Search .......... 257/E21.665, 257/295, E43.001–E43.007, E27.005–E27.006, 257/E27.008, E29.164, E29.272, E29.323, 257/E21.663–E21.664, E21.436; 360/324.11, 360/324.12; 365/158, 173; 438/3, 785, E21.208
See application file for complete search history.

(56) References Cited

U.S. PATENT DOCUMENTS

| | | | |
|---|---|---|---|
| 5,347,485 A | 9/1994 | Taguchi et al. | |
| 5,432,734 A | 7/1995 | Kawano et al. | |
| 5,448,515 A | 9/1995 | Fukami et al. | |
| 5,695,864 A | 12/1997 | Slonczewski | |
| 5,949,622 A | 9/1999 | Kamiguchi et al. | |
| 6,005,800 A | 12/1999 | Koch et al. | |
| 6,100,188 A | 8/2000 | Lu et al. | |
| 6,124,711 A | 9/2000 | Tanaka et al. | |
| 6,137,662 A | 10/2000 | Huai et al. | |
| 6,146,775 A | 11/2000 | Fujita et al. | |
| 6,172,904 B1 | 1/2001 | Anthony et al. | |
| 6,175,476 B1 | 1/2001 | Huai et al. | |
| 6,185,079 B1 | 2/2001 | Gill | |
| 6,196,465 B1 | 3/2001 | Awano | |
| 6,198,610 B1 * | 3/2001 | Kawawake et al. | 360/324.12 |
| 6,201,673 B1 | 3/2001 | Rottmayer et al. | |
| 6,205,052 B1 | 3/2001 | Slaughter et al. | |

(Continued)

FOREIGN PATENT DOCUMENTS

| | | |
|---|---|---|
| EP | 0 843 368 | 5/1998 |

(Continued)

OTHER PUBLICATIONS

Slonczewski, et al., "Current-driven excitation of magnetic multilayers", *Journal of Magnetism and Magnetic Materials*, vol. 159, pp. L1-L7, 1996.

(Continued)

*Primary Examiner*—Dao H Nguyen
*Assistant Examiner*—Tram H Nguyen
(74) *Attorney, Agent, or Firm*—Fish & Richardson P.C.

(57) ABSTRACT

Magnetic multilayer structures, such as magnetic or magnetoresistive tunnel junctions (MTJs) and spin valves, having a magnetic biasing layer formed next to and magnetically coupled to the free ferromagnetic layer to achieve a desired stability against fluctuations caused by, e.g., thermal fluctuations and astray fields. Stable MTJ cells with low aspect ratios can be fabricated using CMOS processing for, e.g., high-density MRAM memory devices and other devices, using the magnetic biasing layer. Such multilayer structures can be programmed using spin transfer induced switching by driving a write current perpendicular to the layers.

68 Claims, 8 Drawing Sheets

U.S. PATENT DOCUMENTS

| | | |
|---|---|---|
| 6,211,090 B1 | 4/2001 | Durlam et al. |
| 6,222,707 B1 | 4/2001 | Huai et al. |
| 6,266,218 B1 | 7/2001 | Carey et al. |
| 6,324,093 B1 | 11/2001 | Perner et al. |
| 6,347,049 B1 | 2/2002 | Childress et al. |
| 6,351,355 B1 | 2/2002 | Min et al. |
| 6,351,409 B1 | 2/2002 | Rizzo et al. |
| 6,381,105 B1 | 4/2002 | Huai et al. |
| 6,430,085 B1 | 8/2002 | Rizzo |
| 6,438,026 B2 | 8/2002 | Gillies et al. |
| 6,447,935 B1 | 9/2002 | Zhang et al. |
| 6,469,926 B1 | 10/2002 | Chen |
| 6,473,337 B1 | 10/2002 | Tran |
| 6,518,071 B1 | 2/2003 | Durlam et al. |
| 6,538,859 B1 | 3/2003 | Gill |
| 6,545,906 B1 | 4/2003 | Savtchenko et al. |
| 6,603,677 B2 | 8/2003 | Redon et al. |
| 6,633,498 B1 | 10/2003 | Engel et al. |
| 6,649,960 B1 | 11/2003 | Cross |
| 6,687,098 B1 | 2/2004 | Huai |
| 6,714,444 B2 | 3/2004 | Huai et al. |
| 6,717,194 B2 | 4/2004 | Liu et al. |
| 6,751,149 B2 | 6/2004 | Seyyedy et al. |
| 6,765,819 B1 | 7/2004 | Bhattacharyya et al. |
| 6,768,150 B1 | 7/2004 | Low et al. |
| 6,771,534 B2 | 8/2004 | Stipe |
| 6,791,868 B2 | 9/2004 | Gider et al. |
| 6,801,414 B2 | 10/2004 | Amano et al. |
| 6,801,471 B2 | 10/2004 | Viehmann et al. |
| 6,829,161 B2 | 12/2004 | Huai et al. |
| 6,838,740 B2 | 1/2005 | Huai et al. |
| 6,847,547 B2 | 1/2005 | Albert et al. |
| 6,888,704 B1 | 5/2005 | Diao et al. |
| 6,888,742 B1 | 5/2005 | Nguyen et al. |
| 6,893,741 B2 | 5/2005 | Doerner et al. |
| 6,920,063 B2 | 7/2005 | Huai et al. |
| 6,927,468 B2 | 8/2005 | Yoda et al. |
| 6,933,155 B2 | 8/2005 | Albert et al. |
| 6,950,335 B2 | 9/2005 | Dieny et al. |
| 6,958,927 B1 | 10/2005 | Nguyen et al. |
| 6,967,863 B2 | 11/2005 | Huai |
| 6,979,586 B2 | 12/2005 | Guo et al. |
| 6,985,383 B2 | 1/2006 | Tang et al. |
| 6,985,385 B2 | 1/2006 | Nguyen et al. |
| 6,989,972 B1 | 1/2006 | Stoev et al. |
| 6,992,359 B2 | 1/2006 | Nguyen et al. |
| 7,006,375 B2 | 2/2006 | Covington |
| 7,009,877 B1 | 3/2006 | Huai et al. |
| 7,027,268 B1 | 4/2006 | Zhu et al. |
| 7,057,921 B2 | 6/2006 | Valet |
| 7,088,609 B2 | 8/2006 | Valet |
| 7,098,494 B2 | 8/2006 | Pakala et al. |
| 7,105,372 B2 | 9/2006 | Min et al. |
| 7,106,559 B2 * | 9/2006 | Hasegawa et al. ...... 360/324.11 |
| 7,106,624 B2 | 9/2006 | Huai et al. |
| 7,110,287 B2 | 9/2006 | Huai et al. |
| 7,126,201 B2 | 10/2006 | Matsutera et al. |
| 7,176,065 B2 | 2/2007 | Seyyedy et al. |
| 7,187,577 B1 | 3/2007 | Wang et al. |
| 7,190,558 B2 | 3/2007 | Iwasaki et al. |
| 7,224,601 B2 | 5/2007 | Panchula et al. |
| 7,224,630 B2 | 5/2007 | Andre et al. |
| 7,254,058 B2 | 8/2007 | Hidaka |
| 7,262,064 B2 | 8/2007 | Ohba et al. |
| 7,272,034 B1 | 9/2007 | Chen et al. |
| 7,272,035 B1 | 9/2007 | Chen et al. |
| 7,286,395 B2 | 10/2007 | Chen et al. |
| 7,289,356 B2 | 10/2007 | Diao et al. |
| 7,307,302 B2 | 12/2007 | Saito |
| 7,345,912 B2 | 3/2008 | Luo et al. |
| 7,376,003 B2 | 5/2008 | Iwata et al. |
| 7,379,327 B2 | 5/2008 | Chen et al. |
| 7,430,135 B2 | 9/2008 | Huai et al. |
| 7,570,463 B2 | 8/2009 | Parkin |
| 7,576,956 B2 | 8/2009 | Huai |
| 2002/0015823 A1 | 2/2002 | Mauler et al. |
| 2002/0037595 A1* | 3/2002 | Hosotani ...... 438/3 |
| 2002/0097534 A1 | 7/2002 | Sun et al. |
| 2002/0105827 A1 | 8/2002 | Redon et al. |
| 2002/0135955 A1 | 9/2002 | Ono et al. |
| 2002/0154455 A1 | 10/2002 | Lenssen |
| 2003/0184918 A1 | 10/2003 | Lin et al. |
| 2003/0206383 A1 | 11/2003 | Meguro et al. |
| 2003/0222322 A1 | 12/2003 | Park |
| 2003/0235016 A1 | 12/2003 | Gill |
| 2003/0235070 A1 | 12/2003 | Ooishi |
| 2004/0021189 A1 | 2/2004 | Yoda et al. |
| 2004/0125649 A1 | 7/2004 | Durlam et al. |
| 2004/0130936 A1 | 7/2004 | Nguyen et al. |
| 2004/0136231 A1 | 7/2004 | Huai et al. |
| 2004/0170055 A1* | 9/2004 | Albert et al. ...... 365/173 |
| 2004/0235201 A1 | 11/2004 | Albert et al. |
| 2004/0249428 A1 | 12/2004 | Wang et al. |
| 2005/0018476 A1 | 1/2005 | Kamijima et al. |
| 2005/0041342 A1 | 2/2005 | Huai et al. |
| 2005/0041456 A1 | 2/2005 | Saito |
| 2005/0063222 A1 | 3/2005 | Huai et al. |
| 2005/0093092 A1 | 5/2005 | Tran et al. |
| 2005/0106810 A1 | 5/2005 | Pakala et al. |
| 2005/0110004 A1 | 5/2005 | Parkin et al. |
| 2005/0136600 A1 | 6/2005 | Huai |
| 2005/0174821 A1 | 8/2005 | Zheng et al. |
| 2005/0184839 A1 | 8/2005 | Nguyen et al. |
| 2005/0201022 A1 | 9/2005 | Horng et al. |
| 2005/0207263 A1 | 9/2005 | Okayama et al. |
| 2005/0237787 A1 | 10/2005 | Huai et al. |
| 2005/0248888 A1 | 11/2005 | Dieny et al. |
| 2005/0254286 A1 | 11/2005 | Valet |
| 2005/0254287 A1 | 11/2005 | Valet |
| 2006/0002184 A1 | 1/2006 | Hong et al. |
| 2006/0018057 A1 | 1/2006 | Huai et al. |
| 2006/0049472 A1 | 3/2006 | Diao et al. |
| 2006/0081953 A1 | 4/2006 | Nguyen et al. |
| 2006/0092689 A1 | 5/2006 | Braun et al. |
| 2006/0102969 A1 | 5/2006 | Huai et al. |
| 2006/0114618 A1 | 6/2006 | Hosomi et al. |
| 2006/0128038 A1 | 6/2006 | Pakala et al. |
| 2006/0141640 A1 | 6/2006 | Huai et al. |
| 2006/0187591 A1* | 8/2006 | Gill et al. ...... 360/324.12 |
| 2006/0192237 A1 | 8/2006 | Huai |
| 2006/0221676 A1 | 10/2006 | Qian et al. |
| 2006/0281258 A1 | 12/2006 | Dieny et al. |
| 2007/0015294 A1 | 1/2007 | Horng et al. |
| 2007/0063237 A1 | 3/2007 | Huai et al. |
| 2007/0086121 A1 | 4/2007 | Nagase et al. |
| 2007/0096229 A1 | 5/2007 | Yoshikawa et al. |
| 2007/0121373 A1 | 5/2007 | Koga |
| 2007/0171694 A1 | 7/2007 | Huai et al. |
| 2007/0246787 A1 | 10/2007 | Wang et al. |
| 2007/0279967 A1 | 12/2007 | Luo et al. |
| 2008/0061388 A1 | 3/2008 | Diao et al. |
| 2008/0205121 A1 | 8/2008 | Chen et al. |
| 2008/0219043 A1 | 9/2008 | Yoon et al. |
| 2008/0219044 A1 | 9/2008 | Yoon et al. |
| 2008/0238475 A1 | 10/2008 | Chua-Eoan et al. |
| 2008/0247222 A1 | 10/2008 | Jung et al. |
| 2009/0040855 A1 | 2/2009 | Luo et al. |
| 2009/0050991 A1 | 2/2009 | Nagai |
| 2009/0103354 A1 | 4/2009 | Yoon et al. |
| 2010/0072524 A1 | 3/2010 | Huai |

FOREIGN PATENT DOCUMENTS

| | | |
|---|---|---|
| JP | 2006-093432 | 4/2006 |

| | | |
|---|---|---|
| KR | 2001-75690 | 8/2001 |
| KR | 2002-19017 | 3/2002 |
| KR | 2005-13215 | 2/2005 |
| TW | 446942 | 7/2001 |
| TW | 498167 | 8/2002 |
| TW | 498327 | 8/2002 |
| WO | WO 2004000369 A2 * | 12/2003 |
| WO | WO 2004/008536 | 1/2004 |
| WO | WO 2005/059955 | 6/2005 |
| WO | WO2007/035786 | 3/2007 |
| WO | WO2007/075889 | 7/2007 |
| WO | WO 2007/117392 | 10/2007 |
| WO | WO 2009/003060 | 12/2008 |
| WO | WO 2009/026249 | 2/2009 |

OTHER PUBLICATIONS

Berger, "Emission of spin waves by a magnetic multilayer traversed by a current", *Physical Review B*, vol. 54, No. 13, pp. 9353-9358, Oct. 1, 1996.

Albert, et al., "Spin-polarized current switching of a Co thin film nanomagnet", *Applied Physics Letters*, vol. 77, No. 23, pp. 3809-3811, Dec. 4, 2000.

Doi, et al., "Magnetism of $Co_{1-x}Fe_xNOL$ in Specular Spin-Valves", *IEEE Transactions on Magnetics*, vol. 40, No. 4, pp. 2263-2265, Jul. 2004.

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

Devolder, T. et al., "Instability threshold versus switching threshold in spin-transfer-induced magnetization switching", Physical Review B71, 184401-1-184401-6 (2005).

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

Thirion, C. et al., "Switching of magnetization by nonlinear resonance studied in single nanoparticles", Nature Publishing Group, www.nature.com/naturematerials, vol. 2, 524-527 (2003).

Xi, Haiwen et al., "Spin-current effect on ferromagnetic resonance in patterned magnetic thin film structures", J of Applied Physics 97, 033904 (2005).

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Cowache et al., "Spin-valve structures with NiO pinning layers," IEEE Transactions on Magnetics, vol. 34, Iss. 4, part 1, (Jul. 1998) [abstract only].

Dokupil et al., Magnetostriction in combination with GMR/TMR-structures [online] Jun. 2, 2005, [retrieved pn Sep. 5, 2007] <URL: http://www.science24.com/paper/3919>[abstract only].

Cowburn et al., "Lateral interface anisotropy in nanomagnets," Journal of Applied Physics, 87(9): 7067-7069 (May 1, 2000).

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

USPTO Non-Final Office Action in U.S. Appl. No. 12/210,126, mailed Mar. 1, 2010, 6 pages.

USPTO Non-Final Office Action in U.S. Appl. No. 11/520,858, mailed Dec. 1, 2009, 24 pages.

USPTO Non-Final Office Action in U.S. Appl. No. 11/271,208, mailed Oct. 6, 2006, 6 pages.

USPTO Non-Final Office Action in U.S. Appl. No. 11/318,337, mailed Nov. 16, 2007, 10 pages.

USPTO Final Office Action in U.S. Appl. No. 11/394,056, mailed Feb. 3, 2009 8 pages.

USPTO Non-Final Office Action in U.S. Appl. No. 11/394,056, mailed May 1, 2008, 9 pages.

USPTO Non-Final Office Action in U.S. Appl. No. 11/394,056, mailed Sep. 30, 2009, 9 pages.

Non-Final Office Action in U.S. Appl. No. 11/190,255, mailed Aug. 1, 2008, 24 pages.

Korean Intellectual Property Office, Office Action in Korean Pat. App. No. KR 9-5-2009-035312920, mailed Aug. 25, 2009, 5 pages.

English language translation of Korean Intellectual Property Office, Office Action in Korean Pat. App. No. KR 9-5-2009-035312920, mailed Aug. 25, 2009, 6 pages.

International Search Report and Written Opinion dated Nov. 26, 2008 for Application No. PCT/US2006/048793, 11 pages.

International Search Report and Written Opinion dated Aug. 20, 2008 for Application No. PCT/US2007/008203, 12 pages.

International Search Report and Written Opinion dated Nov. 18, 2008 for Application No. PCT/US2008/068230, 9 pages.

International Search Report and Written Opinion dated Nov. 21, 2008 for PCT/US2008/073512, 11 pages.

USPTO Non-Final Office Action in U.S. Appl. No. 11/769,645, mailed Mar. 6, 2009, 11 pages.

Taiwanese Patent Office, Office Action dated Sep. 29, 2009 for Taiwanese Patent Application No. 95134547 (8 pages).

English language translation of Taiwanese Patent Office, Office Action dated Sep. 29, 2009 for Taiwanese Patent Application No. 95134547 (7 pages).

Supplementary European Search Report dated Oct. 8, 2009 for European Patent Application No. EP06814990.5 (9 pages).

Queste, S. et al., "Microwave permeability study for antiferromagnet thickness dependence on exchange bias field in NiFe/IrMn layers," Journal of Magnetism and Magnetic Materials, vol. 288, pp. 60-65 (Mar. 1, 2005).

English language translation of Korean Office Action in Korean Application No. 10-2008-7009238, mailed Feb. 5, 2010, 8 pages.

Korean Office Action in Korean Application No. 10-2008-7009238, mailed Feb. 5, 2010, 6 pages.

* cited by examiner

MAGNETIC DEVICE HAVING STABILIZED FREE FERROMAGNETIC LAYER

BACKGROUND

This application relates to magnetic materials and structures having at least one free ferromagnetic layer.

Various magnetic materials use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer. Notably, the resistance to the electrical current across the MTJ structure varies with the relative direction of the magnetizations in the two ferromagnetic layers. When the magnetizations of the two ferromagnetic layers are parallel to each other, the resistance across the MTJ structure is at a minimum value $R_P$. When the magnetizations of the two ferromagnetic layers are anti-parallel with each other, the resistance across the MTJ is at a maximum value $R_{AP}$. The magnitude of this effect is commonly characterized by the tunneling magnetoresistance (TMR) defined as $(R_{AP}-R_P)/R_P$.

The relationship between the resistance to the current flowing across the MTJ and the relative magnetic direction between the two ferromagnetic layers in the TMR effect may be used for nonvolatile magnetic memory devices to store information in the magnetic state of the MTJ. Magnetic random access memory (MRAM) devices based on the TMR effect, for example, may be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction. Information is stored based on the relative magnetic direction of the two ferromagnetic layers on two sides of the barrier of the MTJ. For example, binary bits "1" and "0" may be recorded as the parallel and anti-parallel orientations of the two ferromagnetic layers in the MTJ. Recording or writing a bit in the MTJ can be achieved by switching the magnetization direction of the free layer, e.g., by a writing magnetic field generated by supplying currents to write lines disposed in a cross stripe shape, by a current flowing across the MTJ based on the spin transfer effect, or by other means. In the spin-transfer switching, the current required for changing the magnetization of the free layer can be small (e.g., 0.1 mA or lower) and can be significantly less than the current used for the field switching. Therefore, the spin-transfer switching in a MTJ can be used to significantly reduce the power consumption of the cell.

The need for high storage capacity in a magnetic memory device based on MTJ cells requires each MTJ cell to be small in order to increase the number of MTJ cells in a given wafer area. As the size of a MTJ cell reduces, the magnetization direction of the MTJ in each cell can become increasingly sensitive to various factors such as thermal fluctuations, external field disturbances or superparamagnetism. This is in part because the magnetic energy due to the coercivity of the MTJ for storing and maintaining a digital bit reduces with the size of the MTJ cell. When the magnetic energy for storing and maintaining the digital bit is reduced with the cell size below a critical level which usually is multiple times the energy of a source of disturbance, the energy of the disturbance may be sufficient to alter the magnetic state of the MTJ cell and thus change the stored bit. Therefore, the magnetization direction of the MTJ in a sufficiently small cell may unexpectedly change because of any one or a combination of these and other factors and thus alter or erase the stored information in the MTJ. The disturbance may be caused by various factors, such as the thermal energy of the thermal fluctuation around the cell or the energy due to interaction between the MTJ cell and an astray magnetic field present at the cell.

Therefore, it is desirable to increase the coercivity of the free ferromagnetic layer in MTJs and other multilayer structures and thus to stabilize the magnetic direction of the free ferromagnetic layer against various disturbances.

SUMMARY

This application describes magnetic or magnetoresistive tunnel junctions (MTJs) and other magnetic multilayer structures that use a magnetic biasing layer to increase coercivity of the free layer for improved magnetic stability against thermal fluctuations and astray fields. Such MTJs and other magnetic multilayer structures may be used to construct magnetic memory cells in highly integrated circuits such as high-density integrated MRAM chips based on CMOS processing where each cell is small with a low aspect ratio.

In one example, a device is described to include a free ferromagnetic layer having a magnetization direction that is changeable between a first direction and a second opposite direction. A magnetic biasing layer is also formed in this device to be in contact with and magnetically coupled to the free ferromagnetic layer to increase coercivity of the free ferromagnetic layer and to allow the magnetization direction of the free ferromagnetic layer to be changeable between the first direction and the second substantially opposite direction. This device also includes a fixed ferromagnetic layer having a magnetization direction fixed along substantially the first direction and an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer. The free ferromagnetic layer is located between the magnetic biasing layer and the insulator barrier layer.

In another example, a method is described to include the following. A magnetic tunnel junction is provided to comprise a free ferromagnetic layer having a changeable magnetization direction, a fixed ferromagnetic layer having a fixed magnetization direction, and an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer. A magnetic biasing layer is also provided to be in contact with and magnetically coupled to the free ferromagnetic layer to increase coercivity of the free ferromagnetic layer while allowing a magnetization direction of the free ferromagnetic layer to be changeable. The free ferromagnetic layer is located between the magnetic biasing layer and the insulator barrier layer.

In yet another example, this application describes a device that includes a free ferromagnetic layer having a magnetization direction that is changeable, and a magnetic biasing layer formed to be in contact with and magnetically coupled to the free ferromagnetic layer to increase coercivity of the free ferromagnetic layer without pinning a magnetization direction of the free ferromagnetic layer. The magnetic biasing layer has a layer thickness t, an anisotropy constant K and an interface exchange coupling constant J to satisfy $K \cdot t < J$. The MTJ also includes a pinned ferromagnetic layer having a magnetization direction fixed along a predetermined direction and an antiferromagnetic pinning layer in contact with and magnetically coupled to the pinned ferromagnetic layer to cause the magnetization direction of the pinned ferromagnetic layer to be fixed along the predetermined direction. The antiferromagnetic pinning layer has a layer thickness t', an anisotropy constant K' and an interface exchange coupling constant J' to satisfy $K' \cdot t' > J'$. The device further includes a middle layer formed between the free and pinned ferromagnetic layers. The free ferromagnetic layer is located between the magnetic biasing layer and the middle layer. In one implementation, the middle layer may be an insulator barrier layer formed between the free and pinned ferromagnetic layers to effectuate tunneling of electrons between the free and pinned ferromagnetic layers under a bias voltage across the insulator barrier layer. In another implementation, the middle layer may be a non-magnetic metal layer.

These and other implementations, their variations and modifications are described in greater detail in the attached drawings, the detailed description, and the claims.

DETAILED DESCRIPTION

The techniques of using a magnetic biasing layer to stabilize a free ferromagnetic layer described in this application may be applied to a variety of magnetic multilayer structures. In various implementations, the magnetic direction of the free ferromagnetic layer may be switched by using a spin transfer effect. An MTJ is only one example of such structures. Another example of such a multilayer structure having a free ferromagnetic layer is a spin valve structure which can also be used in magnetic memory devices and other magnetic devices. The spin valve can include two ferromagnetic layers and a thin layer of a non-magnetic metal layer as a spacer layer between the two ferromagnetic layers. Similar to MTJs, one ferromagnetic layer is fixed and the other is a free layer. The free layer in the spin valve is subject to the similar stability issues as in MTJs. Thus, the biasing layer may also be implemented in the spin valve. The following examples use MTJs as examples to illustrate the designs, examples, and operations of various biasing layers.

Figure 1A:
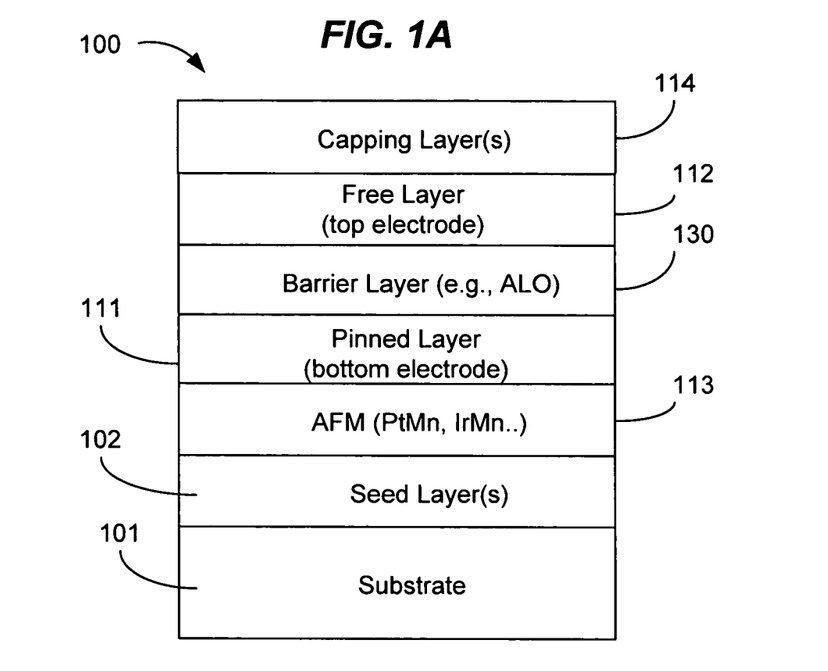
FIG. 1A shows one example of a conventional MTJ cell structure without a magnetic biasing layer.

FIG. 1A illustrates an example of a MTJ 100 formed on a substrate 101 such as a Si substrate. The MTJ 100 is constructed on one or more seed layers 102 directly formed on the substrate 101. On the seed layers 102, an antiferromagnetic (AFM) layer 113 is first formed and then a first ferromagnetic layer 111 is formed on top of the AFM layer 113. After the post annealing, the ferromagnetic layer 111 later is pinned with a fixed magnetization. In some implementations, this fixed magnetization may be parallel to the substrate 101 (i.e., the substrate surface). On top of the first ferromagnetic layer 111 is a thin insulator barrier layer 130 such as a metal oxide layer. In the MTJ 100, a second ferromagnetic layer 112 is formed directly on top of the barrier layer 130. In addition, at least one capping layer 114 is formed on top of the second ferromagnetic layer 112 to protect the MTJ.

The magnetization of the ferromagnetic layer 112 is not pinned and can be freely changed to be parallel to or antiparallel to the fixed magnetization of the pinned layer 111 under a control of either an external control magnetic field or a driving current perpendicularly flowing through the MTJ. For this reason, the layer 112 is a free layer (FL). A magnetic field in the field operating range, or an applied current across the junction in the current operating range, can force the magnetization of the free layer 112 to be substantially parallel to or substantially opposite to the fixed magnetization of the pinned layer 111. Many magnetic systems have competing energy contributions that prevent a perfect parallel or antiparallel alignment of the magnetic domains or nanomagnets in each ferromagnetic layer. In MTJs, the dominant contribution to the energy state of the nanomagnets within the free layer 112 tends to force the nanomagnets into the parallel or antiparallel alignment, thus producing a substantial parallel or antiparallel alignment.

Figure 1B:
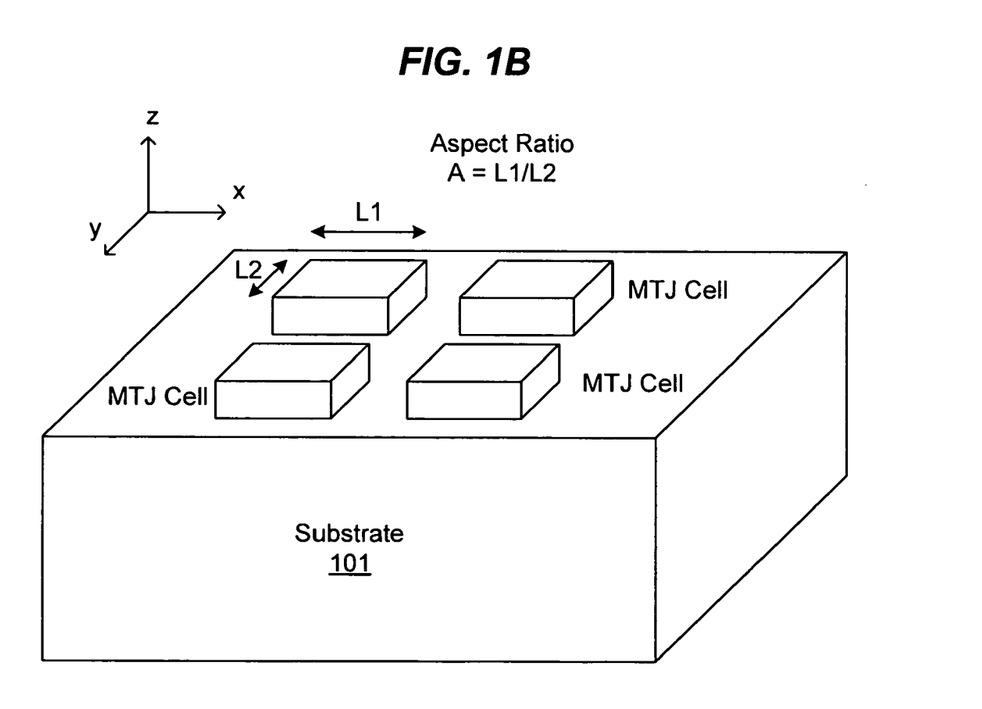
FIGS. 1B and 1C show a MTJ array on a chip and an example of a structure of a CMOS-based chip layout, where each MTJ cell may use a MTJ with a magnetic biasing layer.
Figure 1C:
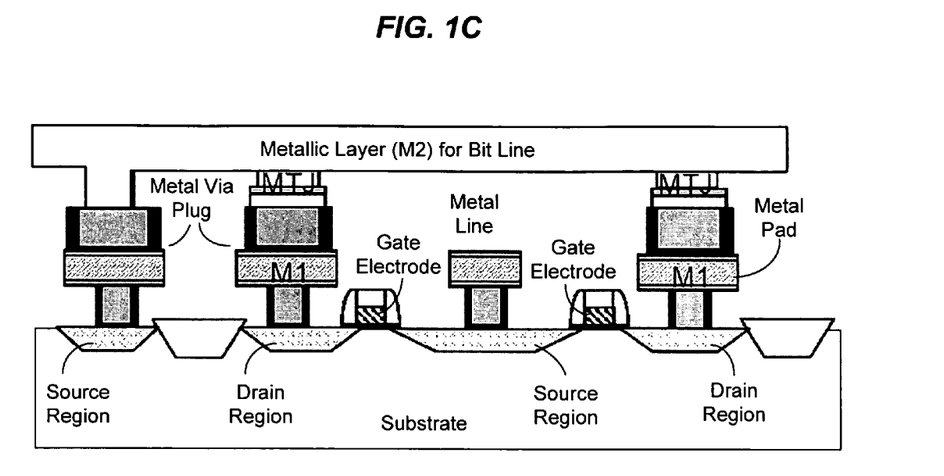

FIG. 1B shows an example of a magnetic memory chip device where a two-dimensional array of MTJ cells based on the MTJ design in FIG. 1A or other MTJ designs are monolithically formed on the substrate 101. A Cartesian coordinate (x, y, z) is used to illustrate different dimensions of the chip. Rectangular blocks in FIG. 1B are used to represent relative positions of MTJ cells and dimensions of each MTJ cell of the memory chip. In an actual device, each cell may be elliptically shaped and elongated along the x direction. FIG. 1C illustrates one exemplary layout of various structures including MTJs of the memory chip in FIG. 1B where each MTJ is fabricated on a metal via plug on the substrate. Each MTJ cell is illustrated to have a length L1 along the x direction and a length L2 along the y direction, wherein both x and y directions are parallel to the plane of the substrate. The aspect ratio of each MTJ cell in the x and y directions is $A = L1/L2$. In order to increase the storage areal density of the memory chip, both L1 and L2 are reduced to increase the number of MTJ cells in a given area in a memory device.

One known technique to increase the thermal stability of the MTJ cells uses the shape anisotropy of the magnetic recording layer of the magnetic cell to spatially favor a particular magnetization direction. In some cases, large shape anisotropy may be used to compensate for the insufficient amount of intrinsic crystalline anisotropy which may be, e.g., from several to tens of Oersted in terms of an anisotropy field.

According to a static-magnetic model, the switching field for an elliptically shaped MTJ cell can be expressed for the films having in-plane dominant anisotropy as $$H_{Keff} = H_{Kins} + H_{Kshape}$$

where $H_{Kins}$ represents the anisotropy field due to crystalline anisotropy and $H_{Kshape}$ represents the anisotropy field due to the shape anisotropy. Notably, $H_{Kshape}$ is proportional to $A \cdot t_F / L_1$ where A is aspect ratio of the MTJ in a plane parallel to the MTJ layers, $L_1$ is the length along the long axis of the magnetic cell and $t_F$ is the thickness of the free layer. Evidently, A should be larger than one, in order to maintain a sufficiently large $H_{Kshape}$ and thus a large effective anisotropy $H_{Keff}$ to meet the thermal stability requirements imposed on the cells. The large anisotropy corresponds to a large thermal activation factor of $(K_u V / k_B T)$, where $K_u$ is the uniaxial anisotropy energy and V is the volume of the free layer.

However, the scaling of the magnetic cell embedded into CMOS manufacturing process may impose limitations to the size, geometry and aspect ratio (A) of the cell. For example, the 130-nm-node CMOS technology can limit the upper limit of the aspect ratio A of the MTJ cells to about 1.77 if the overlap rule is ignored and to around 1 if the overlap rule is taken into account for designing a via size of 0.23 μm with an overlap of 0.055 μm per side. When the more advanced technology node of 90 nm is used, the aspect ratio A of the MTJ cells is actually reduced to 1 from 1.67 for a via size of 0.15 μm with an overlap of 0.03 μm per side. Therefore, due to the CMOS fabrication limitations to the aspect ratio A of each cell, it may be difficult to achieve both a large aspect ratio A and a high cell density at the same time. As such, the approach to stabilizing a MTJ cell based on the shape anisotropy is difficult to implement in memory devices with high areal cell densities. In addition, cells with asymmetric shapes may increase the process complexity during fabrication and the uniformity of the cells may be difficult to control.

This application describes techniques and MTJ cell designs that produce a large anisotropy field or coercivity of the free layer in the MTJ to improve the stability of the MTJ cell against disturbances such as thermal fluctuations and astray fields without requiring the cell shape to be asymmetric. A magnetic cell with a high thermal stability can be achieved with a low aspect ratio due to the large anisotropy field or coercivity of the free layer in the MTJ cell provided by a biasing layer. As a result, standard CMOS fabrication processes can be compatible with fabrication processes of such MTJ cells in small dimensions to construct highly integrated MTJ cell arrays used in MRAM and other devices. In various implementations, the MTJ cells with free layers of high coercivity may be designed to operate based on the spin-transfer induced magnetization switching for recording data. Such MTJ cells may be used to achieve low power consumption and fast writing and readout.

Figure 2:
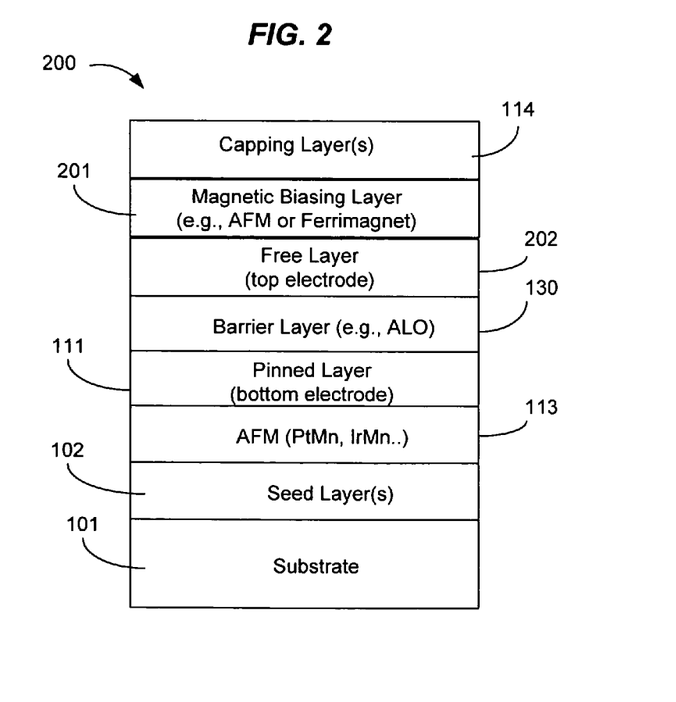
FIG. 2 shows an example of a MTJ with a magnetic biasing layer to increase coercivity of a coupled free layer.

FIG. 2 shows one example of a MTJ cell design 200 which has a free ferromagnetic layer 202 of high coercivity suitable for achieving a desired level of thermal stability at a low aspect ratio. The basic layers for the MTJ in FIG. 2 are similar to the design in FIG. 1. The free layer 202 is different from the free layer 112 in FIG. 1 in that a magnetic biasing layer 201 is formed in contact with and is magnetically coupled to the free layer 202 to increase the coercivity of the free layer 202. The magnetic coupling between the magnetic biasing layer 201 and the free layer 202 is set at a level to allow the magnetization direction of the free layer 202 to be changeable or switched between two opposite directions by, e.g., using a driving current through the MTJ based on the spin-transfer switching. The pinned layer 111 has a fixed magnetization direction which may be along either the first or second direction. The insulator barrier layer 130 is formed between the free and pinned layers 202 and 111 to effectuate tunneling of electrons between the free and pinned layers 202 and 111 under a bias voltage applied between the free and pinned layers 202 and 111 and across the insulator barrier layer 130. The metal for forming the insulator barrier layer 130 may be, for example, aluminum (Al), hafnium (Hf), zirconium (Zr), tantalum (Ta) and magnesium (Mg). In addition, various nitride layers based on different metals may be used to implement the insulator barrier layer 130. Some examples are an aluminum nitride (e.g., AlN), a Ti nitride (e.g., TiN), an AlTi nitride (e.g., TiAlN) and a magnesium nitride. Each of the layers 111, 202 and 114 may have a multilayer structure to include two or more sublayers. The magnetic biasing layer 201 may be antiferromagnetic or ferrimagnetic.

In this design, the ferromagnetic layer 111 is in contact with the AFM layer 113 and is magnetically coupled to the AFM layer 113. The ferromagnetic layer 111 is not "free" and cannot be switched because its magnetization direction is fixed by the AFM layer 113. The AFM layer 113 is specifically designed to pin the magnetization direction of the ferromagnetic layer 111. In this context, the AFM layer 113 may be characterized by three parameters: its layer thickness $t_{AF}$, its anisotropy constant $K_{AF}$ and its interface exchange coupling constant $J_{int}$ with the ferromagnetic layer 111. When these parameters for the AFM layer 113 meet the condition of $$K_{AF} \cdot t_{AF} > J_{int},$$

the magnetic anisotropy of the AFM layer 113 dominates and the AFM layer 113 magnetically controls the anisotropy of the layer 111 via the magnetic coupling between the layers 113 and 111. Under this condition, the magnetization direction of the ferromagnetic layer 111 is fixed by the unidirectional anisotropy of the AFM layer 113. This pinning condition may be achieved by, e.g., using a large AFM layer thickness $t_{AF}$, an AFM material with a large anisotropy constant $K_{AF}$, or both large $t_{AF}$ and large $K_{AF}$. The pinning condition can be achieved with an AFM material which has a large AFM layer thickness $t_{AF}$ but a relatively small $K_{AF}$.

The magnetic biasing layer 201 is designed to be magnetically different from the AFM layer 113 for pinning the layer 111 and to provide a different function from the AFM layer 113. Although the layer 201 and the free layer 202 are magnetically coupled to each other, the free layer 202 is still "free" and its magnetization direction can be changed by the driving current based on the spin-transfer switching. As such, the biasing layer 201 is designed to meet the following condition:

$$K_{AF} \cdot t_{AF} < J_{int}.$$

When the thickness of the magnetic biasing layer 201 is set to be small, the exchange bias field can be negligibly small but the coercivity increases with the AFM layer thickness due to the increase of the total anisotropy energy in the free layer 202. Hence, the magnetic biasing layer 201 is designed to provide a large anisotropy field for the free layer 202. In various implementations, the AFM material for the magnetic biasing layer 201 is selected to have a blocking temperature higher than the operating temperatures of the MTJ cell, a large interface exchange coupling constant $J_{int}$, and an appropriately large anisotropy constant $K_{AF}$. For antiferromagnetic materials, the Neel temperature is the blocking material. For a ferrimagnetic material, its Curie temperature is the blocking temperature. In many applications, the thickness $t_{AF}$ of the magnetic biasing layer 201 may be set at a fixed value or changeable. The other two parameters $K_{AF}$ and $J_{int}$ are, therefore, adjusted and selected to achieve the condition of $K_{AF} \cdot t_{AF} < J_{int}$ so that the anisotropic field or coercivity Hc in the free layer 202 is sufficient to match the requirement of the thermal stability for the magnetic cell design.

For fixed values of $J_{int}$ and $K_{AF}$, the critical AFM thickness is $t_{AFcritical} = J_{int}/K_{AF}$ and is used as an indicator of set-on of the exchange bias field Hex between the two operating regimes. For two widely used AFM materials IrMn and PtMn, the estimated values for $t_{AFcritical}$ are 40 and 80 Å, respectively with $J_{int}$=0.04(IrMn) and 0.08(PtMn) erg/cm² and $K_{AF}$=1×10⁺⁵ erg/cm³. In actual device implementations, the values may vary from the above estimates due to various complexities in fabrication processes.

The magnetic biasing layer 201 is designed to be within the regime of $K_{AF} \cdot t_{AF} < J_{int}$ to deliver a sufficiently large coercivity for the adjacent free layer 202. As an example, for a magnetic cell design with $K_u V/k_B T$=55 which may be required for data retention for 10 years, the corresponding coercivity in the free layer is about 100 Oe when an IrMn AFM layer is used as the magnetic biasing layer for Area=0.02 μm², $t_F$=25 Å, Ms=1050 emu/cc, and A=1:1. However, the existing experimental data suggest that most noticeable Hc will be within tens of Oersted and that Hc usually also increases with the exchange bias field Hex. In such a circumstance, the use of the magnetic biasing layer with the free layer to enhance the anisotropy of the latter may necessitate an AFM stack structure and process engineering to suppress the Hex but enhance coercivity within the regime of $K_{AF} \cdot t_{AF} < J_{int}$.

Figures 3A, 3B:
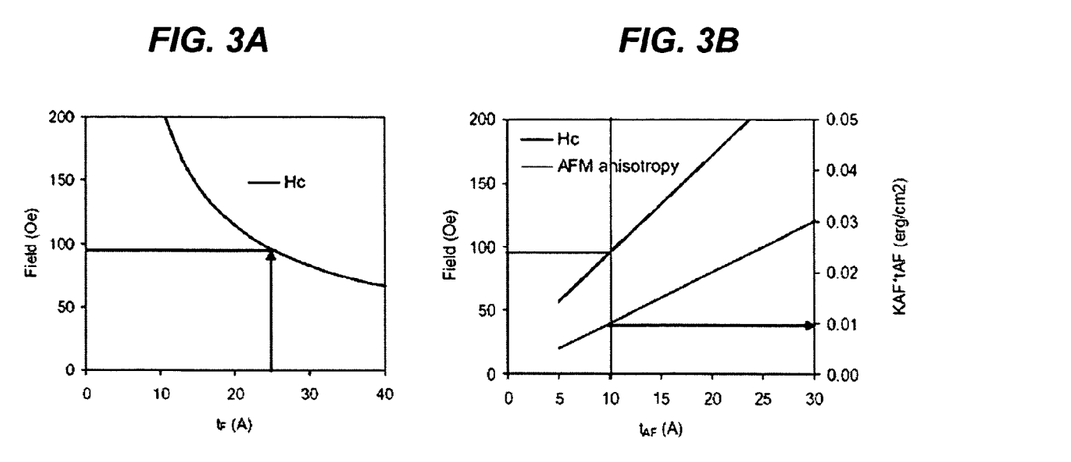
FIGS. 3A and 3B show magnetic properties of exemplary magnetic biasing layers and the coupled free layers based on the MTJ design in FIG. 2.

FIG. 3A shows a mode of Hc enhancement in the regime of $K_{AF} \cdot t_{AF} < J_{int}$ where $K_{AF}$=1×10⁺⁵ erg/cm³, $t_F$=25 Å, and Ms=1050 emu/cc. FIG. 3B shows an anisotropic energy from an AFM magnetic biasing layer (IrMn) requiring $K_{AF} \cdot t_{AF}$ to be 0.01 erg/cm² or more for producing a large coercivity Hc in the free layer.

The magnetic biasing layer 201 in FIG. 2 may be implemented in various configurations. For example, the magnetic biasing layer 201 may be made of a single AFM layer with an offset composition via process condition control such that the Mn content ranges from 50 to 95 at. % for IrMn, and from 30 to 80 at. % for PtMn. The layer thickness may be from 10 to 200 Å.

As another example, the magnetic biasing layer 201 may be a bilayer of two AFM sublayers respectively made from two AFM materials AFM1 and AFM1, or a stack of the bilayers of AFM1 and AFM2. Each AFM sublayer may have a thickness of 10-200 Å and may be formed from IrMn or PtMn. For example, the sublayer AFM1 may have the Mn content within 75-85 at. % for IrMn or 45-55 at. % for PtMn. The layer thickness may be 20-40 Å for IrMn and 40-80 Å for PtMn. The sublayer AFM2 may have the Mn content within 50-85 or 85-95 at. % for IrMn, and 5-45 or 55-80 at. % for PtMn with an adjustable layer thickness.

The magnetic biasing layer 201 may also be a trilayer of three layers where a non-magnetic spacer placed between two AFM layers AFM1 and AFM2 (i.e., AFM1/spacer/AFM2), or a multilayer stack of two or more bilayers AFM1/spacer (Spacer=Ru, Ta, Cu, NiFeCr, 2-20 Å).

In these and other examples, the AFM1 and AFM2 layers may have similar or different compositions and structures. In the magnetic biasing layer with two or more sublayers, the AFM sublayer which interfaces with the free layer is designed to have a thickness less than the AFM critical layer thickness. This provides further control of exchange bias field Hex while enhancing the coercivity Hc as the total magnetic biasing layer grows.

Magnetron sputtering may be used to fabricate the magnetic biasing layers. Alternatively, an ion beam assisted deposition process using IBD can be used to modify the layer structure and content to enhance Hc but reduce Hex. In addition, ion irradiation of a magnetic biasing layer in a field may be used to enhance Hc while decreasing Hex.

Various AFM materials may be used as to construct one or more sublayers of the entire magnetic biasing layer 201. For example, any or a combination of any two or more of the following AFM materials may be used: (1) metallic AFM materials: IrMn, PtMn, PtPdMn, NiMn, FeMn(Rh), CrMn, FeNiMn, CoMn, RhMn, CrMn(Pt, Cu, Rh, Pd, Ir, Ni, Co, Ti), and CrAl; (2) oxide AFM materials: Ni(Fe)O, Fe(Co)O, Co(Fe)O, NiFe(Co)O, CrO; and (3) FeS. In addition, each AFM material for the magnetic biasing layer 201 may also be replaced by one or a combination of two or more ferrimagnetic materials like TbCo, DyCo, TbFe, TbFeCo, CoFeO, FeO, and (Mn, Zn)FeO. In the above composition expressions, the element in ( ) represents a content-poor element. For example, in Fe(Co)O, the content of Co is less than Fe.

The via processing in CMOS design and manufacturing imposes overlap rules and thus limits the aspect ratio and size of a magnetic cell. MTJ cells using the magnetic biasing layers improve the thermal stability of the free layer and allow for stable MTJ cells fabricated within the limitations of the CMOS processing. The free layer may be designed with a small thickness and a small magnetic moment to reduce the spin-transfer switching current density needed for switching the magnetization direction of the free layer based on the spin transfer effect. The presence of the magnetic biasing layer allows for such a thin free layer to be achieved with enhanced coercivity and desired thermal stability.

Once the size and aspect ratio of MTJ cells are reduced to below a dimension of 200 nm or under 100 nm, such small MTJ cells tend to be thermally unstable and subject to the edge effect of the magnetic domain structure and astray field influence. The edge effect tends to reorient the spin states by causing spin curling up or creating spin vortex states. The reorientation of spin can degrade the magnetic performance of magnetic cells and increase the data error rate in information storage. The use of the magnetic biasing layer may be used to address these issues in various implementations so that the spins align along the easy axis of the magnetic biasing layer due to anisotropic energy interaction between the magnetic biasing layer and free layer, improving the magnetic performance of the magnetic cells.

Notably, the enhanced coercivity in the free layer due to the magnetic interaction with the magnetic biasing layer allows the MTJ cell to achieve a desired level of stability against thermal fluctuations and astray magnetic fields without relying on the shape anisotropy of the cell. As such, if the degree of the cell shape anisotropy is limited, such as when the cells are fabricated with CMOS processing with a dimension around 100 nm, the use of the magnetic biasing layer allows the MTJ cells to be designed and fabricated to comply with the aspect ratios imposed by the CMOS processing techniques. In this context, the geometry or aspect ratio of magnetic cells is no longer a limiting factor to the MTJ cells. Therefore, the use of the magnetic biasing layer can facilitate the cell design and layout. In addition, the coercivity of the free layer can be set to a desired amount by tuning the anisotropy of the magnetic biasing layer via structure and process control. This tuning can be achieved with relative ease and with improved uniformity and process margin in comparison to controlling of the aspect ratio of each cell in CMOS processing.

Various examples for layers other than the magnetic biasing layer in the design in FIG. 2 are described below.

1. Free Layer

The free layers (FL) are Co, Fe, Ni or their alloys with crystalline structure or with amorphous states modified by boron or other amorphous forming elements addition at different composition (0-30 at. %). The saturation magnetization of the free layer can be adjusted between 400-1500 emu/cm$^3$ by varying the composition of amorphous forming elements. The layer thickness may be controlled so that the output signal (while optimizing current induced switching) remains at an acceptable level.

The free layer could be a single layer or a multiple layer configuration. For a single layer case, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers (such as synthetic anti-ferromagnetic where two ferromagnetic layers are separated by a non-magnetic spacer). The spacer layer used in this synthetic structure also provides advantage of a diffusion stop layer against the possible diffusion of Mn element used in an antiferromagnetic layer into a barrier layer. The ferromagnetic layers could be Co, CoFe(5-40%), CoFe(5-40%)B(5-30%) CoFe(5-40%)Ta (5-30%), NiFe(~20%), CoPt(5-40%), CoPd(5-40%), FePt(5-40%), CO$_2$Mn(Al, Si) or CO$_2$(Cr,Fe)(Al, Si). Ferrimagnetic layers could be CoGd(15-35%) or FeGd(10-40%). The non-magnetic spacer could be Ru, Re or Cu. All compositions are in atomic percent.

2. Pin Layer

The pin layers (PL) are Co, Fe, Ni or their alloys with crystalline structure or with amorphous states modified by boron or other amorphous forming elements addition at different composition (0-30 at. %). The pin layer could be a single layer or a multiple layer configuration. For a single layer case, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers (such as synthetic anti-ferromagnetic where two ferromagnetic layers are separated by a non-magnetic spacer). The ferromagnetic layers could be Co, CoFe(5-40%), CoFe(5-40%)B(5-30%), CoFe(5-40%)Ta(5-30%), NiFe(~20%), CoPt(5-40%), CoPd (5-40%), FePt(5-40%), Co$_2$Mn(Al, Si) or Co$_2$(Cr,Fe)(Al, Si). Ferrimagnetic layers could be CoGd(15-35%) or FeGd(10-40%). The non-magnetic spacer could be Ru, Re or Cu. All compositions are in atomic percent.

3. Barrier Layer

The tunneling barrier layer could be either single layers of AlO(40-70%), MgO(30-60%), AlO(40-70%)N(2-30%), AlN (30-60%) and Al(Zr, Hf, Ti, Ta)O or a multilayer of the above films with crystalline structure or with amorphous states. The barrier layers with thickness between 5 Å and 40 Å are processed by depositing original metal starting material and then oxidizing the deposited films using natural oxidation and/or plasma oxidation, or by rf sputtering original oxide starting material so that there is tunneling current across the barrier. The resistance-area product range of the barrier is between 10 and 100Ω-μm$^2$. The structure of the interfaces between the barrier and free layer as well as the barrier and the pinned layer are optimized to get maximum spin polarization of electrons (polarization>40%) as well as maximum tunneling magnetoresistance (TMR) values (e.g., TMR>20%).

4. Spacer Layer

In a spin valve cell, the barrier layer 130 described above for MTJ cells is replaced by a non-magnetic metal spacer layer. Examples for the spacer material include Cu, Ag, Pt, Ru, Re, Rh, Ta, Ti, combinations of two or more these metals, or alloys of these metals. The non-magnetic spacer layer may be made of one or more of the above metals in combination with a nano-oxide (NOL) layer or current confinement layer insertion. In some implementations, the non-magnetic spacer may be formed by first depositing original metal starting material and then oxidizing the deposited films using natural oxidation and/or plasma oxidation, or by rf sputtering an original oxide starting material. The starting metal material may use the materials similar to pin or free layer material such as magnetic material CoFe, CoFeB, and non magnetic material Al, Ta, Ru, and Ti. The current confinement layer could be Cu/CoFe, FeSi, Al, Ta, Ru or Ti/NOL/Cu for instance.

Figure 4:
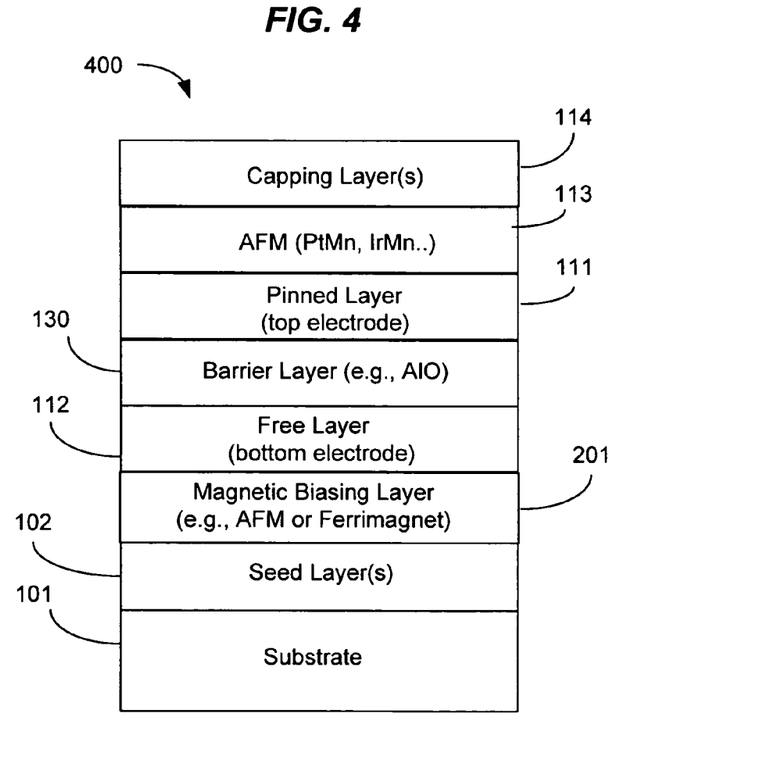
FIGS. 4 and 5 show two examples of MTJs using magnetic biasing layers.

The MTJ cell with a magnetic biasing layer in FIG. 2 uses a "bottom MTJ" configuration where the pinned ferromagnetic layer 111 is located between the barrier layer 130 and the substrate 101. Alternatively, the free layer 202 and its magnetic biasing layer 201 may be placed under the barrier layer 130 and above the substrate 101 in a "top MTJ" configuration. FIG. 4 shows one example 400 of such an MTJ where the magnetic biasing layer 201 is directly grown on top of the seed layer(s) 102.

Figure 5:
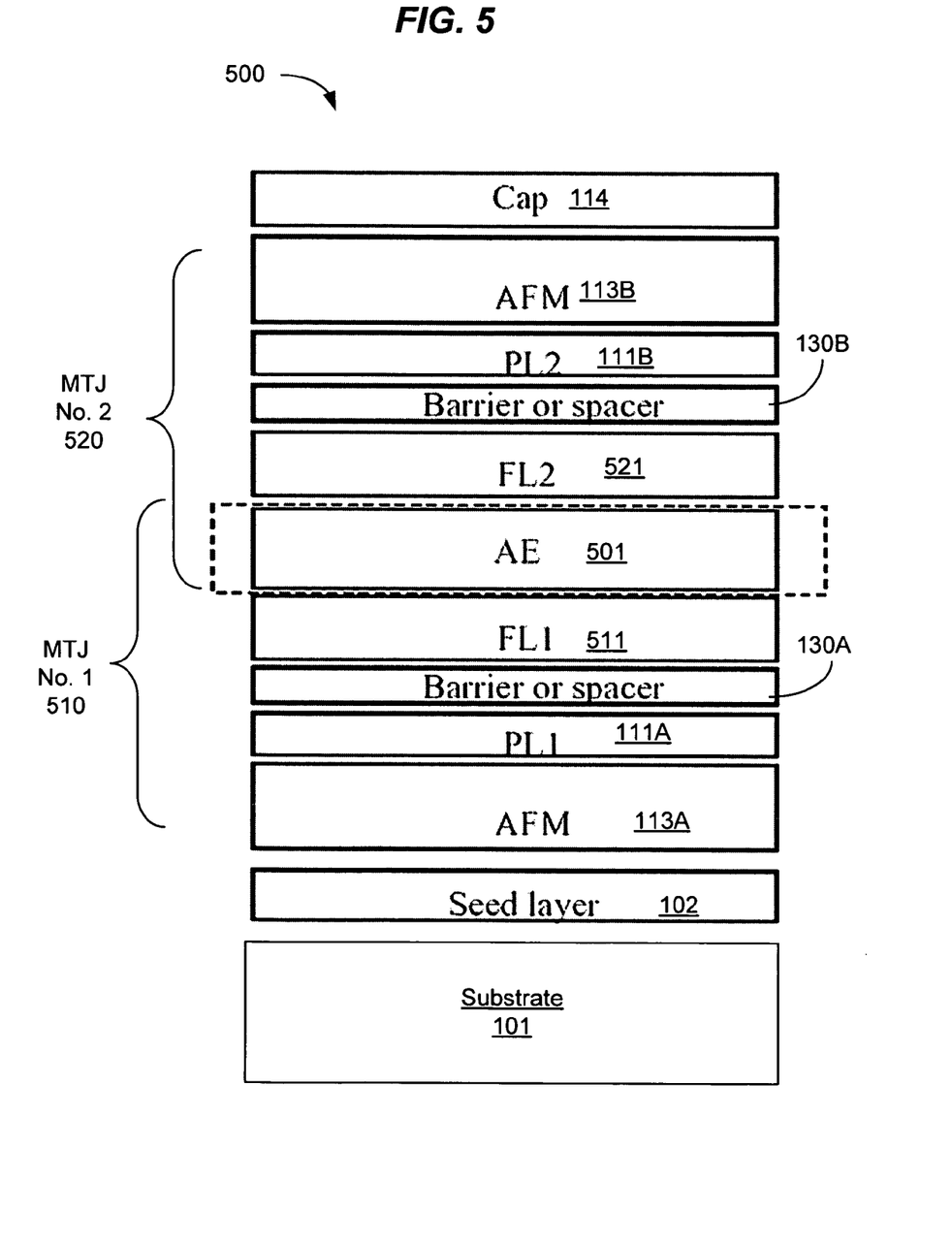

More complex structures may be constructed based on the above MTJs with magnetic biasing layers. FIG. 5 shows a dual MTJ structure 500 where two MTJs 510 and 520 are stacked over each other and share a common magnetic biasing layer 501. In this example, the first MTJ 510 has a pinning AFM layer 113A directly formed on the top of the seed layers 102 and other layers of the MTJ 510, the pinned layer 111A, the barrier layer 130A, the free layer 511 and the magnetic biasing layer 501, are sequentially placed above the AFM layer 113A. The magnetic biasing layer 501 for the MTJ 510 is also the magnetic biasing layer for the MTJ 520 which includes a free layer 521, a barrier layer 130B, a pinned layer 111B and a pinning AFM layer 113B that are sequentially placed on top of the magnetic biasing layer 501. One or more capping layers 114 are then formed on the top of the MTJ 520.

In the above magnetic cell designs, the current used to switch the magnetization direction of the free layer based on the spin transfer can be reduced by reducing the lateral dimension of the free layer. Reduction of the switching current can reduce the power consumption of the memory cell and mitigate thermal dissipation issues in highly integrated memory cell designs. In addition to having the biasing layer to enhance the thermal stability of the thin free layer, the cell geometry may be designed to achieve a lower spin transfer switching current density.

Figure 6A:
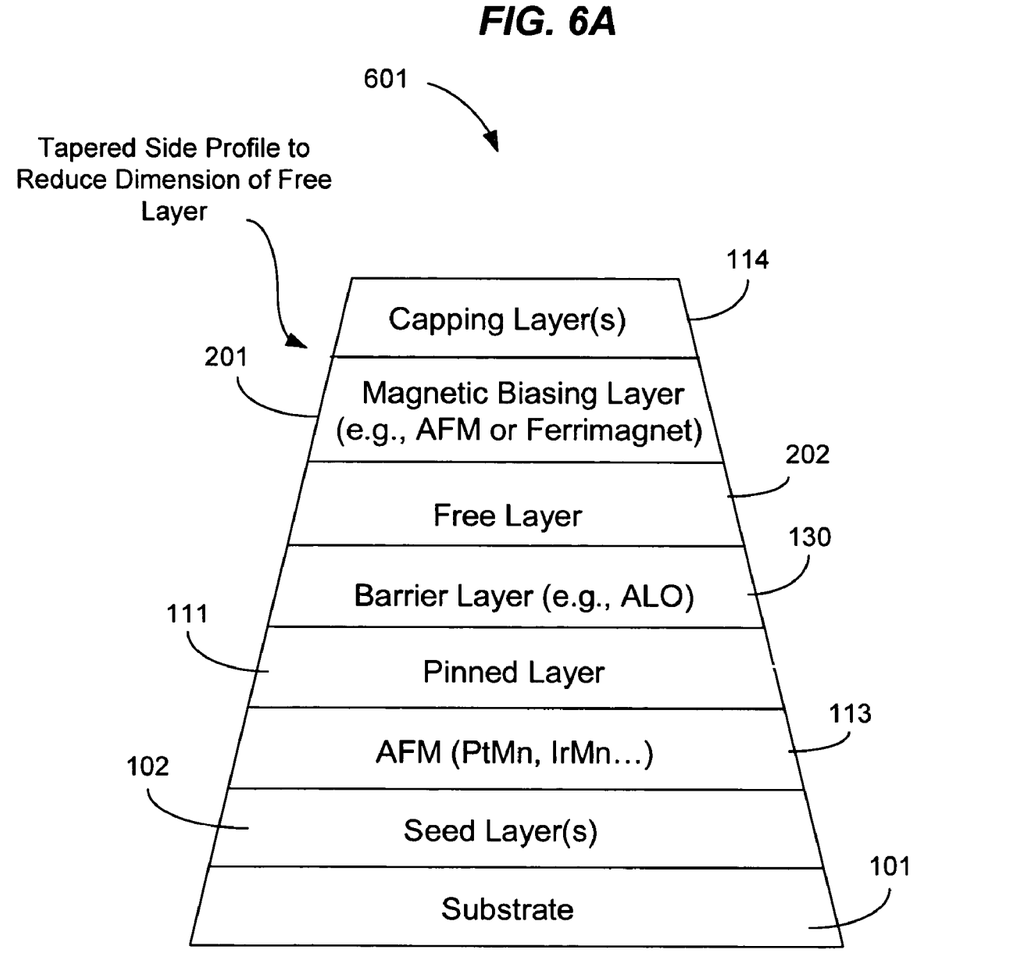
FIGS. 6A and 6B show two alternative implementations of the cell design in FIG. 2 to reduce the dimension of the free layer and to reduce the spin-transfer based switching current.
Figure 6B:
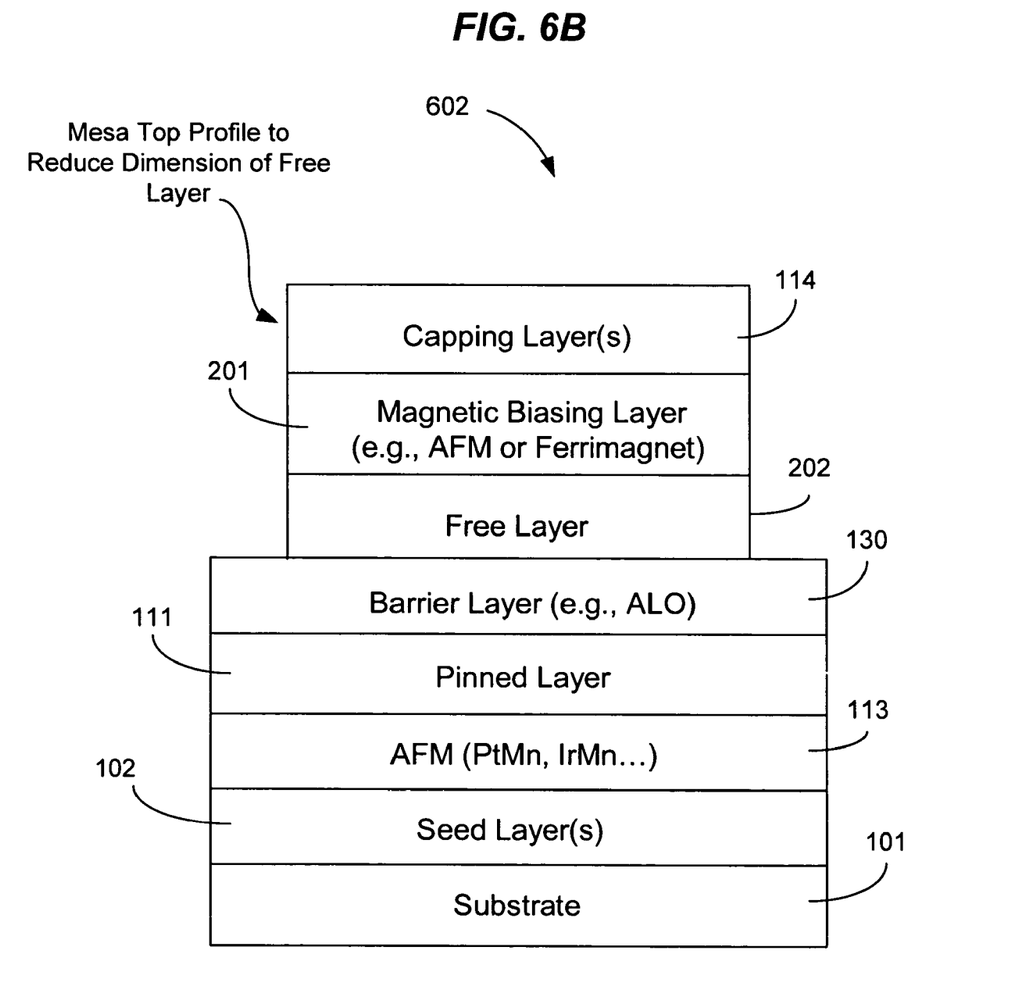

FIGS. 6A and 6B show two cell profile designs for implementing the cell design in FIG. 2 with a reduced dimension of the free layer. In FIG. 6A, the side profile of the multilayer stack 601 for each cell is sloped or tapered to reduce the lateral dimension of the free layer 202. In FIG. 6B, the multilayer stack 602 for each cell is shaped as a reverse T shape to have a mesa top which includes the free layer 202 and the magnetic biasing layer 201 and a bottom with the barrier layer 130, the pinned layer 111, the AFM layer 113, the seed layer 102. The dimension of the mesa top is less than the dimension of the bottom to reduce the lateral dimension of the free layer in the mesa top. Similarly, FIGS. 7A and 7B show two cell profile designs for implementing the cell design in FIG. 5 with a reduced dimension of the free layer.

Figure 7A:
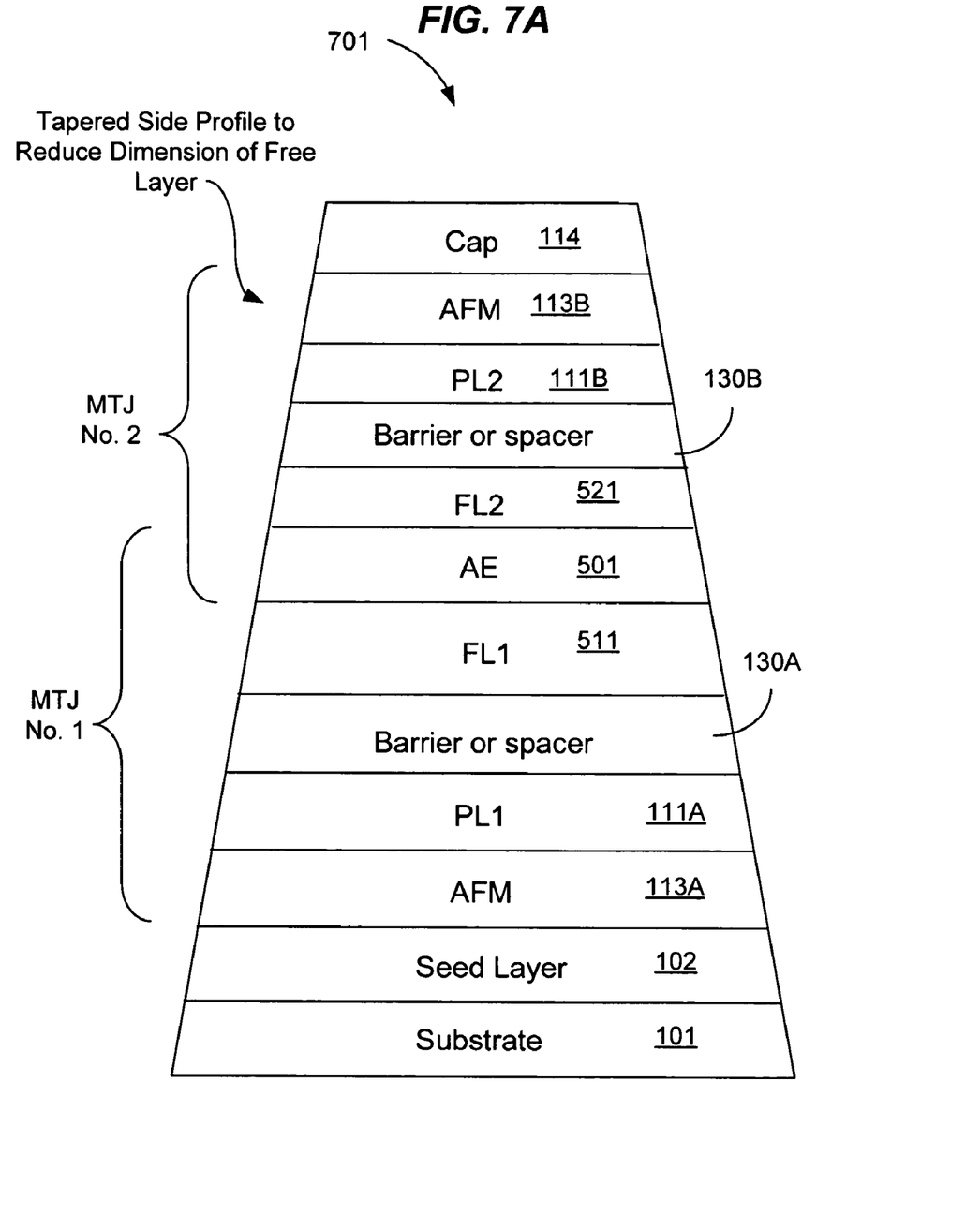
FIGS. 7A and 7B show two alternative implementations of the cell design in FIG. 5 to reduce the dimension of the free layers and to reduce the spin-transfer based switching current.
Figure 7B:
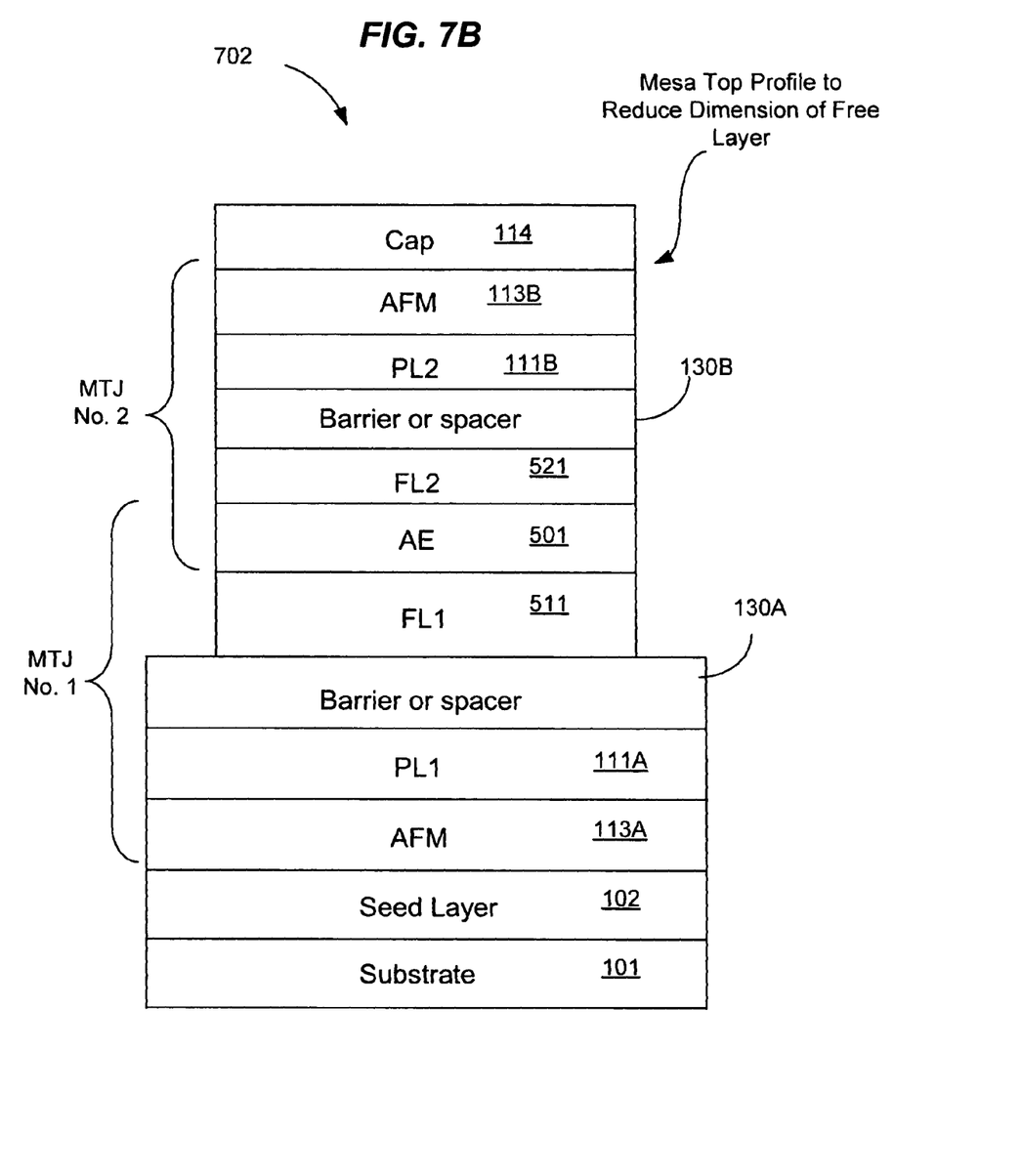

The above sloped sidewall profile in FIGS. 6A and 7A may be obtained by a sloped masking layer during processing, and the reverse T shape in FIGS. 6B and 7B may be obtained by using a sidewall spacer process.

The above illustrated examples for a MTJ structure may also be replaced by a spin valve structure by replacing the MTJ barrier insulator layer with a non-magnetic metal spacer layer. In FIG. 5, for example, the dual structure shown can be a dual spin filter which stacks a spin valve and a MTJ over each other by replacing one of the two barriers with a non-magnetic spacer layer.

An MRAM memory devices based on the above MTJ cells with magnetic biasing layers can be designed to use the spin-transfer switching for recording bits in the cells. Circuit elements for making row selection and column selection, including word lines and bit lines are included in the MRAM memory device. A write current source for supplying the polarized current for recording data and a read current source for supplying a sensing current for readout are also provided in the memory device. The spin transfer switching in such a memory device can be implemented in various configurations. Current knowledge of spin transfer is described in detail in J. C. Slonczewski, "Current-driven Excitation of Magnetic Multilayers," Journal of Magnetism and Magnetic Materials, vol. 159, p. L1-L5 (1996); L. Berger, "Emission of Spin Waves by a Magnetic Multilayer Traversed by a Current," Phys. Rev. B, Vol. 54, p. 9353 (1996), and in F. J. Albert, J. A. Katine and R. A. Burhman, "Spin-polarized Current Switching of a Co Thin Film Nanomagnet," Appl. Phys. Lett., vol. 77, No. 23, p. 3809-3811 (2000). The spin transfer can be, however, implemented in other configurations beyond the techniques described in the above referenced publications.

Based on the above referenced publications, the spin-transfer effect arises from the spin-dependent electron transport properties of ferromagnetic-normal metal multilayers. When a spin-polarized current traverses a magnetic multilayer structure in a direction perpendicular to the layers, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$-$10^8$ A/cm$^2$), and if the dimensions of the multilayer are small (approximately less than two hundred nanometers) so that effects of the helical magnetic field produced by the perpendicular current are not important. In addition, to reduce the switching current for changing the magnetization direction of the free layer, the ferromagnetic layer should be sufficiently thin, for instance, preferably less than approximately ten nanometers for Co in some implementations. A thin free layer, in absence of the magnetic biasing layer, has less coercivity and is less stable than a thicker free layer which requires a greater switching current. The use of the magnetic biasing layer allows for the free layer to be thin to achieve a small switching current while still maintaining a sufficient level of coercivity in the free layer against thermal fluctuations and astray magnetic fields.

Examples of magnetic devices having stabilized free ferromagnetic layers and methods for making and using the devices have been disclosed. One of ordinary skill in the art can readily recognize that variations, modifications and enhancements to the described examples may be made.

What is claimed is:

1. A device, comprising:
    a magnetic tunnel junction (MTJ) element which comprises:
        a free ferromagnetic layer having a magnetization direction that is changeable between a first direction and a second substantially opposite direction;
        a magnetic biasing layer formed to be in contact with and magnetically coupled to the free ferromagnetic layer to increase coercivity of the free ferromagnetic layer and to allow the magnetization direction of the free ferromagnetic layer to be changeable between the first direction and the second substantially opposite direction, wherein the magnetic biasing layer has a layer thickness t, an anisotropy constant K and an interface exchange coupling constant J that satisfy K·t<J;
        a fixed ferromagnetic layer having a magnetization direction fixed along substantially the first direction; and
        an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer,
        wherein the free ferromagnetic layer is located between the magnetic biasing layer and the insulator barrier layer; and
    a circuit coupled to the MTJ to supply an electric current perpendicularly through the MTJ element and operable to switch the magnetization direction of the free ferromagnetic layer based on spin transfer effect caused by the electric current.

2. The device as in claim 1, wherein the magnetic biasing layer comprises an antiferromagnetic (AFM) layer which is magnetically coupled to the free ferromagnetic layer to increase the coercivity of the free ferromagnetic layer without fixing the magnetization direction of the free ferromagnetic layer.

3. The device as in claim 2, wherein the magnetic biasing layer comprises PtMn.

4. The device as in claim 2, wherein the magnetic biasing layer comprises at least one of PtPdMn, NiMn, FeMn, FeMnRh, CrMn, FeNiMn, CoMn, RhMn, CrMnPt, CrMnCu, CrMnRh, CrMnPd, CrMnIr, CrMnNi, CrMnCo, CrMnTi and CrAl.

5. The device as in claim 2, wherein the magnetic biasing layer comprises a metallic antiferromagnetic material.

6. The device as in claim 2, wherein the magnetic biasing layer comprises an oxide antiferromagnetic material.

7. The device as in claim 6, wherein the magnetic biasing layer comprises at least one of Ni(Fe)O, Fe(Co)O, Co(Fe)O, NiFe(Co)O and CrO.

8. The device as in claim 2, wherein the magnetic biasing layer comprises FeS.

9. The device as in claim 2, wherein the magnetic biasing layer comprises a ferrimagnetic material.

10. The device as in claim 9, wherein the magnetic biasing layer comprises at least one of TbCo, DyCo, TbFe, TbFeCo, CoFeO, FeO, MnFeO and ZnFeO.

11. The device as in claim 1, wherein the magnetic biasing layer comprises two antiferromagnetic layers.

12. The device as in claim 1, wherein the magnetic biasing layer comprises:
    an antiferromagnetic layer; and
    a spacer layer in contact with the antiferromagnetic layer.

13. The device as in claim 1, further comprising:
a second free ferromagnetic layer in contact with and magnetically coupled to the magnetic biasing layer to have a changeable magnetization direction and increased coercivity;
a second fixed ferromagnetic layer having a fixed magnetization direction; and
a second insulator barrier layer formed between the second free ferromagnetic layer and the second fixed ferromagnetic layer to effectuate tunneling of electrons between the second free ferromagnetic layer and the second fixed ferromagnetic layer under a bias voltage applied between the second free ferromagnetic layer and the second fixed ferromagnetic layer and across the second insulator barrier layer.

14. The device as in claim 1, further comprising:
a second free ferromagnetic layer in contact with and magnetically coupled to the magnetic biasing layer to have a changeable magnetization direction and increased coercivity;
a second fixed ferromagnetic layer having a fixed magnetization direction; and
a non-magnetic spacer layer formed between the second free ferromagnetic layer and the second fixed ferromagnetic layer to form a spin valve with the second free ferromagnetic layer and the second fixed ferromagnetic layer.

15. The device as in claim 1, wherein the magnetic biasing layer, the free ferromagnetic layer, the insulator barrier layer and the fixed ferromagnetic layer form a stack with a side profile that is tapered so that a lateral dimension of the free ferromagnetic layer is less than the fixed ferromagnetic layer.

16. The device as in claim 1, wherein the magnetic biasing layer, the free ferromagnetic layer, the insulator barrier layer and the fixed ferromagnetic layer form a stack which comprises a mesa top having the free ferromagnetic layer and a bottom having the fixed ferromagnetic layer, wherein the mesa top has a lateral dimension less than the bottom so that a lateral dimension of the free ferromagnetic layer is less than the fixed ferromagnetic layer.

17. The device as in claim 1, wherein the free ferromagnetic layer comprises a single ferromagnetic layer.

18. The device as in claim 1, wherein the free ferromagnetic layer comprises a plurality of layers.

19. The device as in claim 18, wherein the plurality of layers in the free ferromagnetic layer comprise a combination of magnetic materials, and wherein each of the magnetic materials is either ferromagnetic or ferrimagnetic.

20. The device as in claim 19, wherein a ferromagnetic material in the plurality of layers in the free ferromagnetic layer comprises Co, an alloy comprising Co, Fe, an alloy comprising Fe, Ni, or an alloy comprising Ni.

21. The device as in claim 20, wherein a ferromagnetic material in the plurality of layers in the free ferromagnetic layer comprises CoFe, CoFeB, CoFeTa, NiFe, CoPt, CoPd, FePt, $Co_2Mn(Al, Si)$ or $Co_2(Cr,Fe)(Al, Si)$.

22. The device as in claim 18, wherein the plurality of layers in the free ferromagnetic layer comprise a combination of magnetic and non-magnetic layers.

23. The device as in claim 22, wherein the combination of magnetic and non-magnetic layers in the free ferromagnetic layer comprises two ferromagnetic layers and a non-magnetic spacer between the two ferromagnetic layers.

24. The device as in claim 23, wherein a ferromagnetic material in the plurality of layers in the free ferromagnetic layer comprises Co, an alloy comprising Co, Fe, an alloy comprising Fe, Ni, or an alloy comprising Ni.

25. The device as in claim 24, wherein a ferromagnetic material in the plurality of layers in the free ferromagnetic layer comprises CoFe, CoFeB, CoFeTa, NiFe, CoPt, CoPd, FePt, $Co_2Mn(Al, Si)$ or $Co_2(Cr,Fe)(Al, Si)$.

26. The device as in claim 23, wherein the non-magnetic spacer between the two ferromagnetic layers in the free ferromagnetic layer comprises Ru, Re or Cu.

27. The device as in claim 18, wherein the magnetic biasing layer, the free ferromagnetic layer, the insulator barrier layer and the fixed ferromagnetic layer are patterned to form a unit cell with an aspect ratio of 1 between dimensions along two orthogonal directions parallel to each layer.

28. The device as in claim 18, wherein the magnetic biasing layer, the free ferromagnetic layer, the insulator barrier layer and the fixed ferromagnetic layer are patterned to form a unit cell with an aspect ratio of less than 1.77 between dimensions along two orthogonal directions parallel to each layer.

29. The device as in claim 1, wherein the magnetic biasing layer, the free ferromagnetic layer, the insulator barrier layer and the fixed ferromagnetic layer are patterned to form a unit cell with an aspect ratio of 1 between dimensions along two orthogonal directions parallel to each layer.

30. The device as in claim 1, wherein the magnetic biasing layer, the free ferromagnetic layer, the insulator barrier layer and the fixed ferromagnetic layer are patterned to form a unit cell with an aspect ratio of less than 1.77 between dimensions along two orthogonal directions parallel to each layer.

31. A device, comprising:
a magnetic tunnel junction (MTJ) element which comprises:
a free ferromagnetic layer having a magnetization direction that is changeable;
a magnetic biasing layer formed to be in contact with and magnetically coupled to the free ferromagnetic layer to increase coercivity of the free ferromagnetic layer without pinning a magnetization direction of the free ferromagnetic layer, wherein the magnetic biasing layer has a layer thickness t, an anisotropy constant K and an interface exchange coupling constant J that satisfy $K \cdot t < J$;
a pinned ferromagnetic layer having a magnetization direction fixed along a predetermined direction;
an antiferromagnetic pinning layer in contact with and magnetically coupled to the pinned ferromagnetic layer to cause the magnetization direction of the pinned ferromagnetic layer to be fixed along the predetermined direction, wherein the antiferromagnetic pinning layer has a layer thickness t', an anisotropy constant K' and an interface exchange coupling constant J' that satisfy $K' \cdot t' > J'$; and
a middle layer formed between the free and pinned ferromagnetic layers,
wherein the free ferromagnetic layer is located between the magnetic biasing layer and the middle layer; and
a circuit coupled to the MTJ to supply an electric current perpendicularly through the MTJ element and operable to switch the magnetization direction of the free ferromagnetic layer based on spin transfer effect caused by the electric current.

32. A device as in claim 31, wherein the magnetic biasing layer comprises an antiferromagnetic material having a Neel temperature above an operating temperature of the device.

33. A device as in claim 31, wherein the magnetic biasing layer comprises a ferrimagnetic material having a Curie temperature above an operating temperature of the device.

34. A device as in claim 31, wherein the middle layer is an insulator barrier layer formed between the free and pinned ferromagnetic layers to effectuate tunneling of electrons between the free and pinned ferromagnetic layers under a bias voltage across the insulator barrier layer.

35. A device as in claim 31, wherein the middle layer is a non-magnetic metal spacer layer.

36. The device as in claim 31, wherein the free ferromagnetic layer has a lateral dimension less than the pinned ferromagnetic layer and the antiferromagnetic pinning layer.

37. The device as in claim 31, wherein the free ferromagnetic layer comprises a single ferromagnetic layer.

38. The device as in claim 31, wherein the free ferromagnetic layer comprises a plurality of layers.

39. The device as in claim 31, wherein the magnetic biasing layer, the free ferromagnetic layer, the middle layer, the pinned ferromagnetic layer and the antiferromagnetic pinning layer are patterned to form a unit cell with an aspect ratio of 1 between dimensions along two orthogonal directions parallel to each layer.

40. The device as in claim 31, wherein the magnetic biasing layer, the free ferromagnetic layer, the middle layer, the pinned ferromagnetic layer and the antiferromagnetic pinning layer are patterned to form a unit cell with an aspect ratio of less than 1.77 between dimensions along two orthogonal directions parallel to each layer.

41. A device, comprising:
an array of a plurality of magnetic cells arranged in rows and columns, wherein each magnetic cell comprises:
a free ferromagnetic layer having a magnetization direction that is changeable between a first direction and a second substantially opposite direction,
a magnetic biasing layer formed to be in contact with and magnetically coupled to the free ferromagnetic layer to increase coercivity of the free ferromagnetic layer and to allow the magnetization direction of the free ferromagnetic layer to be changeable between the first direction and the second substantially opposite direction, wherein the magnetic biasing layer has a layer thickness t, an anisotropy constant K and an interface exchange coupling constant J that satisfy K·t<J,
a fixed ferromagnetic layer having a magnetization direction fixed along substantially the first direction, and
an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer, wherein the free ferromagnetic layer is located between the magnetic biasing layer and the insulator barrier layer;
circuit elements coupled to the array of the magnetic cells to make row selection and column selection in the array of the magnetic cells; and
a write current source coupled to the array of the magnetic cells to supply a write current for recording data in a magnetic cell and to switch the magnetization direction of the free ferromagnetic layer based on spin transfer effect by flowing the write current perpendicularly through the magnetic tunnel junction.

42. A device, comprising:
a magnetic tunnel junction (MTJ) element which comprises:
a free ferromagnetic layer having a magnetization direction that is changeable between a first direction and a second substantially opposite direction;
a magnetic biasing layer formed to be in contact with and magnetically coupled to the free ferromagnetic layer to increase coercivity of the free ferromagnetic layer and to allow the magnetization direction of the free ferromagnetic layer to be changeable between the first direction and the second substantially opposite direction, wherein the magnetic biasing layer has a layer thickness t, an anisotropy constant K and an interface exchange coupling constant J that satisfy K·t<J;
a fixed ferromagnetic layer having a magnetization direction fixed along substantially the first direction; and
an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer,
wherein the free ferromagnetic layer is located between the magnetic biasing layer and the insulator barrier layer, and
wherein the MTJ element is configured to allow the free ferromagnetic layer to be switched by spin transfer effect from an electric current passing perpendicularly through the MTJ element.

43. A device, comprising:
a magnetic tunnel junction (MTJ) element which comprises:
a free ferromagnetic layer having a magnetization direction that is changeable;
a magnetic biasing layer formed to be in contact with and magnetically coupled to the free ferromagnetic layer to increase coercivity of the free ferromagnetic layer without pinning a magnetization direction of the free ferromagnetic layer, wherein the magnetic biasing layer has a layer thickness t, an anisotropy constant K and an interface exchange coupling constant J that satisfy K·t<J;
a pinned ferromagnetic layer having a magnetization direction fixed along a predetermined direction;
an antiferromagnetic pinning layer in contact with and magnetically coupled to the pinned ferromagnetic layer to cause the magnetization direction of the pinned ferromagnetic layer to be fixed along the predetermined direction, wherein the antiferromagnetic pinning layer has a layer thickness t', an anisotropy constant K' and an interface exchange coupling constant J' that satisfy K'·t'>J'; and
a middle layer formed between the free and pinned ferromagnetic layers,
wherein the free ferromagnetic layer is located between the magnetic biasing layer and the middle layer, and
wherein the MTJ element is configured to allow the free ferromagnetic layer to be switched by spin transfer effect from an electric current passing perpendicularly through the MTJ element.

44. A device as in claim 43, wherein the middle layer is an insulator barrier layer formed between the free and pinned ferromagnetic layers to effectuate tunneling of electrons between the free and pinned ferromagnetic layers under a bias voltage across the insulator barrier layer.

45. A device as in claim 43, wherein the middle layer is a non-magnetic metal spacer layer.

46. A device, comprising:
a magnetic tunnel junction (MTJ) element which comprises:
a free ferromagnetic layer having a magnetization direction that is changeable between a first direction and a second substantially opposite direction;
a magnetic biasing layer formed to be in contact with and magnetically coupled to the free ferromagnetic layer to increase coercivity of the free ferromagnetic layer and to allow the magnetization direction of the free ferromagnetic layer to be changeable between the first direction and the second substantially opposite direction based on a spin transfer effect, the magnetic biasing layer comprising two or more antiferromagnetic sublayers each of which comprises an oxide antiferromagnetic material or a metallic antiferromagnetic material, wherein the magnetic biasing layer has a layer thickness t, an anisotropy constant K and an interface exchange coupling constant J that satisfy K·t<J;

a fixed ferromagnetic layer having a magnetization direction fixed along substantially the first direction; and an insulator barrier layer formed between the free and fixed ferromagnetic layers to effectuate tunneling of electrons between the free and fixed ferromagnetic layers under a bias voltage applied between the free and fixed ferromagnetic layers and across the insulator barrier layer, wherein the free ferromagnetic layer is located between the magnetic biasing layer and the insulator barrier layer; and a circuit coupled to the MTJ to supply an electric current perpendicularly through the MTJ element and operable to switch the magnetization direction of the free ferromagnetic layer based on the spin transfer effect caused by the electric current.

47. The device as in claim 46, wherein one of the two or more antiferromagnetic sublayers of the magnetic biasing layer in contact with the free ferromagnetic layer comprises an oxide AFM material selected from Ni(Fe)O, Fe(Co)O, Co(Fe)O, NiFe(Co)O, and CrO.

48. The device as in claim 46, wherein one of the two or more antiferromagnetic sublayers of the magnetic biasing layer in contact with the free ferromagnetic layer comprises a metallic AFM material selected from IrMn, PtMn, PtPdMn, NiMn, FeMn(Rh), CrMn, FeNiMn, CoMn, RhMn, CrMn(Pt, Cu, Rh, Pd, Ir, Ni, Co, Ti), and CrAl.

49. The device as in claim 46, wherein one of the two or more antiferromagnetic sublayers, which interfaces with the free ferromagnetic layer, has a thickness less than an antiferromagnetic critical layer thickness.

50. The device as in claim 46, wherein at least one antiferromagnetic sublayer is between 10 Å-200 Å.

51. The device as in claim 46, wherein at least one magnetic biasing sublayer has a layer thickness t, an anisotropy constant K and an interface exchange coupling constant J that satisfy K·t<J.

52. The device as in claim 46, wherein the magnetic biasing layer, the free ferromagnetic layer, the insulator barrier layer and the fixed ferromagnetic layer are patterned to form a unit cell with an aspect ratio of 1 between dimensions along two orthogonal directions parallel to each layer.

53. The device as in claim 46, wherein the magnetic biasing layer, the free ferromagnetic layer, the insulator barrier layer and the fixed ferromagnetic layer are patterned to form a unit cell with an aspect ratio of less than 1.77 between dimensions along two orthogonal directions parallel to each layer.

54. The device as in claim 11, wherein the magnetic biasing layer comprises a stack of the two antiferromagnetic layers.

55. The device as in claim 54, wherein one of the two antiferromagnetic layers comprises an oxide antiferromagnetic material.

56. The device as in claim 54, wherein one of the two antiferromagnetic layers comprises a metallic antiferromagnetic material.

57. The device as in claim 18, wherein the layers in the magnetic biasing layer comprise a plurality of antiferromagnetic layers.

58. The device as in claim 57, wherein one of the antiferromagnetic layers in the magnetic biasing layer comprises an oxide antiferromagnetic material.

59. The device as in claim 57, wherein one of the two antiferromagnetic layers in the magnetic biasing layer comprises a metallic antiferromagnetic material.

60. The device as in claim 38, wherein the layers in the magnetic biasing layer comprise a plurality of antiferromagnetic layers.

61. The device as in claim 60, wherein one of the antiferromagnetic layers in the magnetic biasing layer comprises an oxide antiferromagnetic material.

62. The device as in claim 60, wherein one of the two antiferromagnetic layers in the magnetic biasing layer comprises a metallic antiferromagnetic material.

63. The device as in claim 41, wherein the magnetic biasing layer comprise a plurality of antiferromagnetic layers and wherein one of the antiferromagnetic layers in the magnetic biasing layer comprises an oxide antiferromagnetic material.

64. The device as in claim 63, wherein one of the two antiferromagnetic layers in the magnetic biasing layer comprises a metallic antiferromagnetic material.

65. The device as in claim 42, wherein the magnetic biasing layer comprise a plurality of antiferromagnetic layers and wherein one of the antiferromagnetic layers in the magnetic biasing layer comprises an oxide antiferromagnetic material.

66. The device as in claim 65, wherein one of the two antiferromagnetic layers in the magnetic biasing layer comprises a metallic antiferromagnetic material.

67. The device as in claim 42, wherein the magnetic biasing layer comprise a plurality of antiferromagnetic layers and wherein one of the antiferromagnetic layers in the magnetic biasing layer comprises an oxide antiferromagnetic material.

68. The device as in claim 67, wherein one of the two antiferromagnetic layers in the magnetic biasing layer comprises a metallic antiferromagnetic material.

* * * * *